(12) United States Patent
Michalik et al.

(10) Patent No.: US 10,619,251 B2
(45) Date of Patent: Apr. 14, 2020

(54) ETCHING SOLUTION FOR COPPER AND COPPER ALLOY SURFACES

(71) Applicant: Atotech Deutschland GmbH, Berlin (DE)

(72) Inventors: Fabian Michalik, Berlin (DE); Norbert Lützow, Berlin (DE); Josef Gaida, Berlin (DE); Thomas Hülsmann, Berlin (DE); Gabriela Schmidt, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 21 days.

(21) Appl. No.: 16/065,200

(22) PCT Filed: Dec. 14, 2016

(86) PCT No.: PCT/EP2016/080916
§ 371 (c)(1),
(2) Date: Jun. 22, 2018

(87) PCT Pub. No.: WO2017/108513
PCT Pub. Date: Jun. 29, 2017

(65) Prior Publication Data
US 2019/0003061 A1 Jan. 3, 2019

(30) Foreign Application Priority Data
Dec. 23, 2015 (EP) .................. 15202285

(51) Int. Cl.
*C23F 1/18* (2006.01)
*H05K 3/06* (2006.01)
(Continued)

(52) U.S. Cl.
CPC .............. *C23F 1/18* (2013.01); *C23F 1/02* (2013.01); *H01L 21/32134* (2013.01);
(Continued)

(58) Field of Classification Search
CPC ........ C23F 1/18; C23F 1/02; H01L 23/53233; H01L 23/53228; H01L 21/76838;
(Continued)

(56) References Cited

U.S. PATENT DOCUMENTS

| 5,965,036 A | * 10/1999 | Maki ..................... C23F 1/18 216/105 |
| 6,156,221 A | 12/2000 | Lauffer et al. |

(Continued)

FOREIGN PATENT DOCUMENTS

WO 2010016562 2/2010

OTHER PUBLICATIONS

Hoogenboom R: "Poly(2-oxazoline)s: A Polymer Class with Numerous Potential Applications", Angewandte Chemie International Edition, vol. 48, No. 43, Oct. 12, 2009, pp. 7978-7994.
(Continued)

*Primary Examiner* — Anita K Alanko
(74) *Attorney, Agent, or Firm* — Renner, Otto, Boisselle & Sklar, LLP

(57) ABSTRACT

An etching solution for copper and copper alloy surfaces comprising at least one acid, at least one oxidising agent suitable to oxidise copper, at least one source of halide ions and further at least one polyamide containing at least one polymeric moiety according to formula (I)

(Continued)

wherein each a is independently from each other selected from 1, 2 and 3; each b is an integer independently from each other ranging from 5 to 10000; each $R^1$ is a monovalent residue independently from each other selected from the group consisting of substituted or unsubstituted C1-C8-alkyl groups and a method for its use are provided. Such etching solution is particularly useful for retaining the shape of treated copper and copper alloy lines.

16 Claims, 5 Drawing Sheets

(51) Int. Cl.
*H05K 3/38* (2006.01)
*H01L 21/3213* (2006.01)
*C23F 1/02* (2006.01)
*H01L 21/768* (2006.01)
*H01L 23/532* (2006.01)
*C09K 13/06* (2006.01)

(52) U.S. Cl.
CPC .. *H01L 21/76838* (2013.01); *H01L 23/53228* (2013.01); *H01L 23/53233* (2013.01); *H05K 3/067* (2013.01); *H05K 3/383* (2013.01); *C09K 13/06* (2013.01); *H01L 21/32139* (2013.01); *H05K 2203/0789* (2013.01); *H05K 2203/0796* (2013.01)

(58) Field of Classification Search
CPC ........ H01L 21/32134; H01L 21/32139; H05K 3/383; H05K 3/067; H05K 2203/0796; H05K 2203/0789; C09K 13/06
See application file for complete search history.

(56) References Cited

U.S. PATENT DOCUMENTS

| 9,057,141 | B2 | 6/2015 | Barz et al. |
| 2006/0175204 | A1 | 8/2006 | Matejat et al. |
| 2011/0253668 | A1 | 10/2011 | Winoto et al. |
| 2012/0031872 | A1* | 2/2012 | Sekiguchi ............. B82Y 10/00 216/13 |

OTHER PUBLICATIONS

Hoogenboom R et al.: "Living cationic polymerizations utilizing an automated synthesizer: high-throughput synthesis of polyoxazolines", Macromolecular Rapid Communications, vol. 24, No. 1, Jan. 2003, pp. 92-97.
PCT/EP2016/080916; PCT International Search Report and Written Opinion of the International Searching Authority dated Jan. 20, 2017.

* cited by examiner

1A

1B

1C

1D

2A

2B

2C

2D

2E

2F

ETCHING SOLUTION FOR COPPER AND COPPER ALLOY SURFACES

The present application is a U.S. National Stage Application based on and claiming benefit and priority under 35 U.S.C. § 371 of International Application No. PCT/EP2016/080916, filed 14 Dec. 2016, which in turn claims benefit of and priority to European Application No. 15202285.1 filed 23 Dec. 2015, the entirety of both of which is hereby incorporated herein by reference.

FIELD OF THE INVENTION

The present invention relates to an etching solution for copper and copper alloy surfaces. Particularly, it relates to an etching solution for copper and copper alloy surfaces which is useful in the field of electronics industry for producing printed circuit boards, IC substrates, interposers etc.

BACKGROUND OF THE INVENTION

In the production of printed circuit boards, the surface of copper is treated to promote the adhesion between the copper surface and a resist before coating the copper surface with a dry film of etching photoresists, solder resists, etc. In the treatment of substrates carrying fine wiring pattern, the chemical etching is usually used. In the production of multi-layered printed circuit boards, it has been attempted to promote the adhesion between a copper electroconductive patterned layer and a resin layer, for example, by forming an oxide layer on the copper surface and reducing the oxide layer to metallic copper by a reducing agent while maintaining the geometric shape of the oxide layer.

A negative pattern of the circuit is formed by a) applying an etch resist, e.g., a polymeric dry film resist or a metal resist on a layer of copper, b) etching away those portions of copper not covered by the etch resist, and c) removing the etch resist from the remaining copper circuit.

Etching solutions applied for this task are selected from different types of compositions such as mixtures of an oxidising agent and an acid. Two main types of etching solutions are based on an acid such as sulphuric acid or hydrochloric acid and contain as oxidising agent hydrogen peroxide, copper ions or ferric ions. Such etching solutions are disclosed in C. F. Coombs, Jr., "Printed Circuits Handbook", 5$^{th}$ Ed. 2001, Chapter 33.4.3, pages 33.14 to 33.15 and Chapter 33.4.5, pages 33.17.

The ongoing miniaturization of circuits in terms of line width/interline-space values and thickness of the copper layers to be etched does not allow to using conventional etching solutions such as the ones described above.

The disadvantage of known etching solutions is even more present if the copper tracks are manufactured by a semi additive process (SAP). Here, the bare dielectric substrate is first coated with a seed layer serving as an electrically conductive layer. The seed layer comprises for example copper deposited by electroless plating. Next, a patterned resist layer is formed on the seed layer and a thicker, second copper layer is deposited by electroplating into the openings of the patterned resist layer onto the seed layer. The patterned resist layer is stripped and the seed layer in between copper tracks deposited by electroplating needs to be removed by a differential etch step. The seed layer deposited by electroless plating has a finer grain structure than the second copper layer deposited by electroplating. The different grain structures can lead to a different etching behaviour of the individual copper layers.

A similar situation is present when copper tracks are manufactured by a modified semiadditive process (m-SAP) or advanced modified SAP (Am-SAP) wherein a thick, second copper layer is deposited in the openings of the patterned resist layer onto a first thin layer of copper. The first copper layer is manufactured, e.g. by thinning a copper clad attached to the dielectric substrate. Again, both first and second copper layer have a different grain structure.

The etching solution applied for the differential etching step should only remove the first copper layer in-between the copper tracks while not (substantially) attacking the sidewalls and the top of the copper tracks deposited by electroplating and the underlying first copper layer or copper seed layer.

Etching solutions based on sulphuric acid and hydrogen peroxide lead to an undesired undercutting of the first copper layer during etching (FIG. 1b) which results in an insufficient adhesion of the copper layer on the dielectric substrate. WO 2010/016562 discloses compositions for copper etching containing polyvinylpyrrolidinones (PVP) in conjunction with ferric and copper ions as oxidising agent. The use of PVP in such copper etching compositions also causes undercuts (see comparative Application Example 2b).

Etching solutions based on sulphuric acid and ferric ions typically show an etching behaviour as shown in FIG. 1c. This trapezoidal line shape is undesired because the broader base of the etched copper line can lead to circuit shorts which are not acceptable. This phenomenon of forming trapezoid etching results is referred to herein as "line shape alteration".

A further undesired side effect of copper etching is the reduction of line width in general. This is typically caused by too strong etching dissolving copper ions from all surfaces of the treated copper lines (see FIG. 1d).

EP 0855454 A1 teaches cationic polymers to be used in copper etching solutions. Such cationic polymers include inter alia amine bearing polymers such as polyethylenimines. Polyethylenimines containing etching solutions, however, alter the line shape and reduce the line width of treated copper lines resulting in irregular line shapes (see comparative Application Example 3c and 3d). This is highly undesired as it impairs the electrically conductive layout of electronic appliances causing inter alia shorter life-times of such goods.

Objective of the Present Invention

It is therefore the objective of the present invention to provide an etching solution for etching of copper and copper alloys and a method for its use overcoming the restrictions and disadvantages of the prior art. It is also an objective of the present invention to provide an etching solution for etching of copper and copper alloys and a method for its use resulting in an improved retention of the geometrical structures of copper or copper alloy lines after treatment such as rectangular line shape (measurable by the top-bottom-difference), a less pronounced line width reduction and avoidance of undercuts.

SUMMARY OF THE INVENTION

Above-mentioned objectives are solved by the etching solution for copper and copper alloy surfaces according to claim 1 and its use. Preferred embodiments of the present invention can be found in the dependent claims. These objectives are further solved by the method according to claim 14.

DESCRIPTION OF THE FIGURES

In FIG. 1B, the copper line is labelled with 1 and the undercut with 2. The undercut can be seen to be present below the copper line. FIG. 1C depicts a copper line with an undesired line shape alteration. The shown copper line has a trapezoidal shape and the dashed line highlights the desired rectangular shape. FIG. 1D shows the untreated copper line of FIG. 1A (above) and a treated copper line below and the line width reduction is stressed by the dashed line.

DETAILED DESCRIPTION OF THE INVENTION

Figure 1:
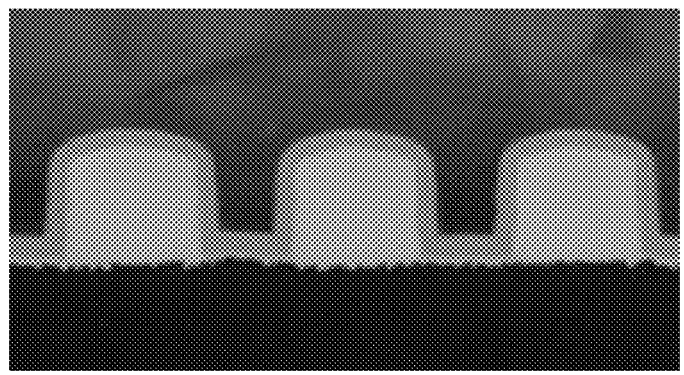
FIG. 1 shows cross sections of various copper lines depicting
a) an untreated copper line (FIG. 1A);
b) a copper line with an undercut formation (FIG. 1B);
c) a copper line with a line shape alteration (FIG. 1C); and
d) a copper line with a line width reduction (FIG. 1D).
Figure 1:
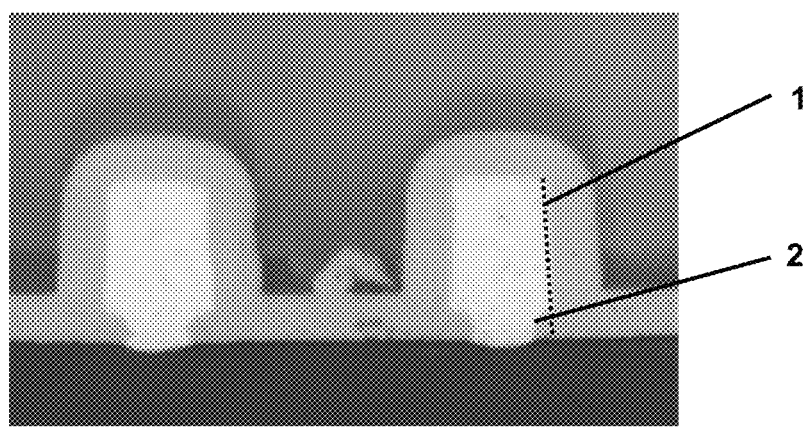
Figure 1:
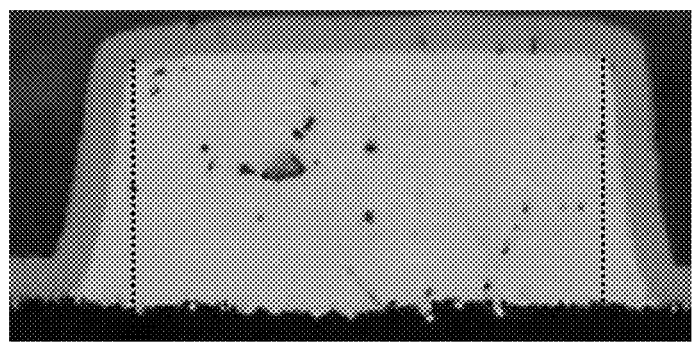
Figure 1:
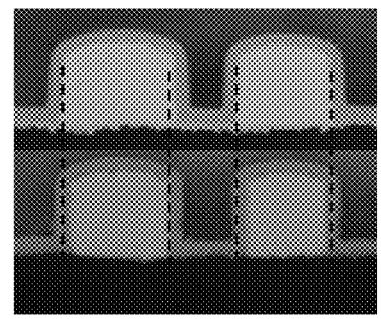
Figure 2:
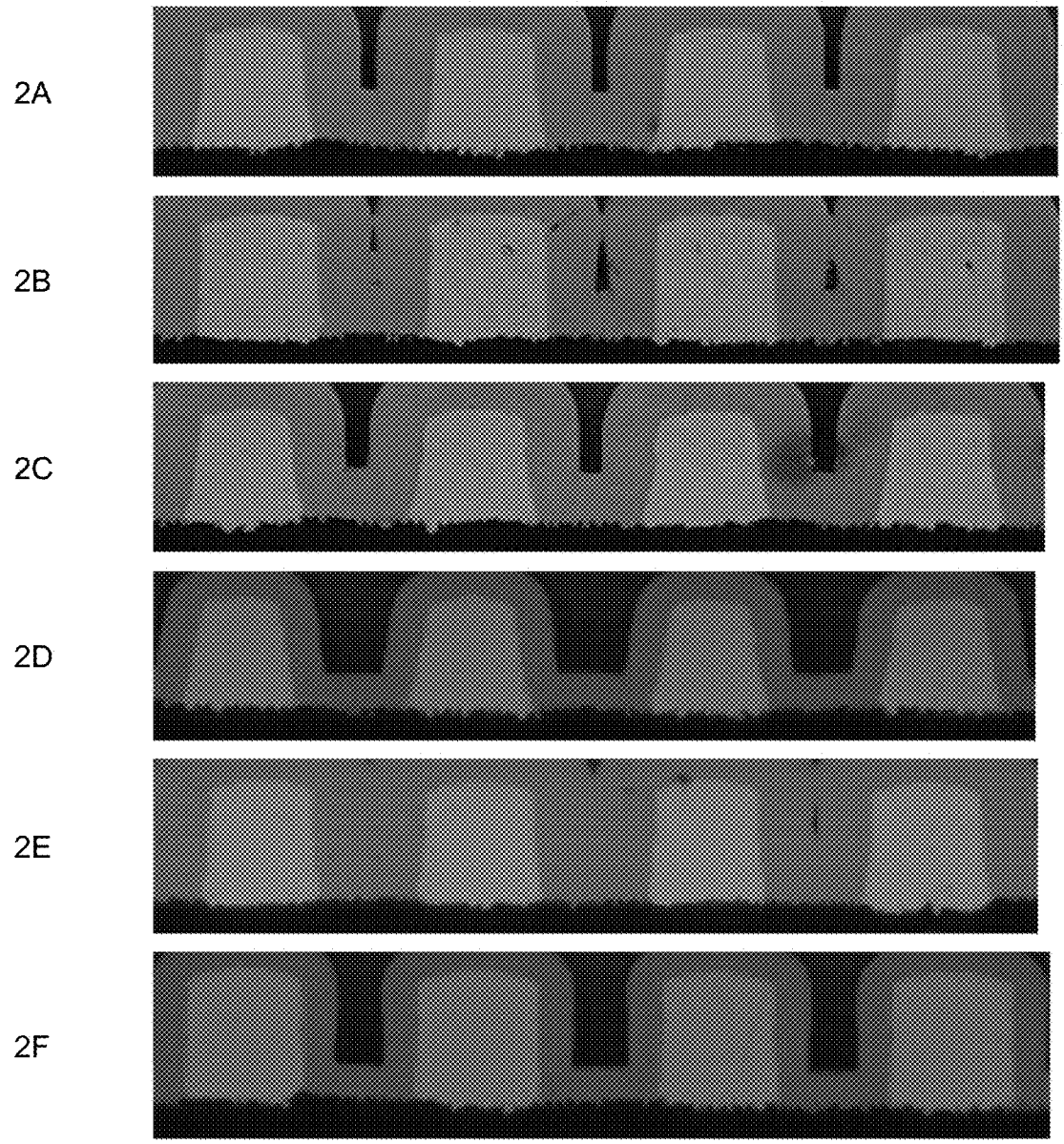
FIG. 2 shows cross sections of copper lines treated with various etching solutions as reported in Application Example 2.

Percentages throughout this specification are weight-percentages (wt.-%) unless stated otherwise. One exception are yields which are given as percentage of the theoretical yield. Concentrations given in this specification refer to the volume of the entire solutions unless stated otherwise.

The aqueous etching solution for copper and copper alloy surfaces comprises at least one acid, at least one oxidising agent suitable to oxidise copper, at least one source of halide ions and is characterised in that it comprises at least one polyamide containing at least one polymeric moiety according to formula (I)

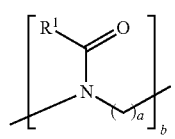
(I)

wherein each a is independently from each other selected from 2 and 3; each b is an integer independently from each other ranging from 5 to 10000; each $R^1$ is a monovalent residue independently from each other selected from the group consisting of substituted or unsubstituted C1-C8-alkyl groups. This solution will be referred to herein as "etching solution".

The term "alkyl group" according to the present invention comprises branched or unbranched alkyl groups comprising cyclic and/or non-cyclic structural elements, wherein cyclic structural elements of the alkyl groups naturally require at least 3 carbon atoms. The term "C1-CX-alkyl group" according to the present invention refers to alkyl groups having 1 to X carbon atoms. C1-C8-alkyl for example includes, among others, methyl, ethyl, n-propyl, iso-propyl, n-butyl, iso-butyl, sec-butyl, tert-butyl, n-pentyl, iso-pentyl, sec-pentyl, tert-pentyl, neo-pentyl, hexyl, heptyl and octyl. Substituted alkyl groups may theoretically be obtained by replacing at least one hydrogen by a functional group like an amino, hydroxyl, thiol, alkoxyl and thioalkyl. Preferably, alkyl groups are not substituted or they are substituted by hydroxyl and/or amino groups.

In so far as the term "aryl" is used in this description and in the claims, it refers to ring-shaped aromatic hydrocarbon residue, for example phenyl or naphtyl, where individual ring carbon atoms can be replaced by N, O and/or S, for example benzothiazolyl. Furthermore, aryl residues can be substituted by replacing a hydrogen in each case by a functional group, for example amino, hydroxyl, thiol, alkoxyl and thioalkyl. Preferably, aryl groups are not substituted or they are substituted by hydroxyl and/or amino groups In so far as the term "aralkyl" is used in this description and in the claims, it refers to a hydrocarbon residue consisting of an alkyl and an aryl group such as benzyl and tolyl.

The at least one polymeric moiety according to formula (I) is linear. The at least one polymeric moiety according to formula (I) is thus neither branched nor cross-linked, e.g. to other polymeric moiety according to formula (I). Preferably, the entire polyamide containing at least one polymeric moiety according to formula (I) is linear and neither branched nor cross-linked.

The polymeric moiety according to formula (I) can be a homopolymer or a copolymer. Homopolymers are made of one monomer only, copolymers are made of two or more different monomers. The individual building blocks of the polymers can be arranged in said polymer in any order meaning that said polymers can be, for example, block polymers, statistical polymers, segmented polymers, gradient polymers, periodic polymers or alternating polymers. Copolymers are preferred as they diminish the line width reduction (see Application Example 6).

The mass average molar mass ($M_w$) of the at least one polyamide containing at least one polymeric moiety according to formula (I) preferably ranges from 500 to 1,000,000 amu, more preferably from 1,000 to 500,000 amu. The use of polyamides containing at least one polymeric moiety according to formula (I) having a mass average molar mass below 500 amu in an etching solution might result in a less effective etching results. If the mass average molar mass exceeds 1,000,000 amu the effectiveness also seems to decrease drastically which might be related to the solubility of said polymers. According to further preferred embodiments of the present invention, the mass average molar mass of the at least one polyamide containing at least one polymeric moiety according to formula (I) ranges from 5,000 to 100,000 amu. Aforementioned polyamides surprisingly do allow for improved etching results of copper or copper alloy surfaces while retaining the desired rectangular shapes of copper or copper alloy lines (confer Application Example 5) or they roughen the respective copper or copper alloy surface to provide improved adhesion to organic materials like prepregs including FR-4 and FR-5 (confer Application Example 1). The mass average molar mass can be determined by standard methods such as gel permeation chromatography (GPC) or viscometry, preferably by GPC. A useful method for such GPC measurements can be found in R. Hoogenboom, M. W. M. Fijten, M. A. R. Meier, U. S. Schubert, Macromolecular Rapid Communications, 2003, volume 24 (1), pages 92-97.

Preferably, each monovalent residue $R^1$ is independently from each other selected from the group consisting of C1-C6-alkyl groups. More preferably, each $R^1$ is independently from each other selected from the group consisting of methyl, ethyl, n-propyl, iso-propyl, n-butyl, iso-butyl, sec-butyl and tert-butyl.

In those cases where the polyamide comprises at least two polymeric moieties according to formula (I), said polymeric moieties may be linked directly next to each other or typically, they may be linked by a bridging moiety. Said bridging moiety may be an alkylene, an arylene, or derived from another polymer, particularly from an amine containing polymer and/or it may be a moiety according to formula (II) or an oligomer or polymer formed thereof. Said moiety according to formula (II) is

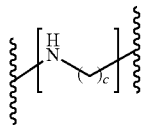

(II)

wherein each c is an integer independently ranging from 1 to 3, preferably from 2 to 3. Preferably, said bridging moiety is a moiety according to formula (II) or an oligomer or polymer formed thereof. An oligomer shall mean in this context a linear molecular entity of 2 to 4 of said moieties; a polymer shall consist of 5 or more of said moieties.

The polyamide containing at least one polymeric moiety according to formula (I) optionally (albeit typically) contains two polymer terminating groups. Such polymer terminating groups (also referred to as end groups in the art) are moieties resulting from the initiation or the termination of the polymerization process. They may originate from solvents wherein the polymerization is carried out, pH-adjustors such as acids or bases, polymerization starters such as nucleophiles such as those comprising an alkyl or aralkyl group, terminating reagents such water or other electrophiles and radical initiators like persulphates, peroxides or azo compounds, chain transfer agents such as sulphur containing compounds including but not limited to thiols, thioalkanols like thioethanol, thio-containing carboxylic acids like thioacetic acid, or monomers. Preferably, the polymer terminating groups are independently from each other selected from the group consisting of hydrogen; hydroxyl; amino; thiol; substituted or unsubstituted C1-C8-alkyl groups including inter alia C1-C8-hydroxyalkyl, C1-C8-aminoalkyl, C1-C8-thioalkyl; iminoalcohols such as α-iminoalkan-ω-ol (e.g. —NH—$(CH_2)_n$—OH; n being an integer and ranging from 1 to 8); aralkyl like benzyl as well as tolyl; and aryl.

Preferably, the polyamide consists of at least one, more preferably of one, polymeric moiety according to formula (I) and two polymer terminating groups independently from each other selected from above-defined groups. More preferably, the terminating groups are independently from each other selected from the group consisting of hydrogen, hydroxyl, amino, thiol, C1-C8-hydroxyalkyl, C1-C8-aminoalkyl, C1-C8-thioalkyl, α-iminoalkan-ω-ol (e.g. —NH—$(CH_2)_n$—OH; n being an integer and ranging from 1 to 8), aralkyl and unsubstituted C1-C8-alkyl groups. Even more preferably, the polyamide consists of the polymeric moiety according to formula (I) and two polymer terminating groups wherein one polymer terminating group is selected from the group consisting of aralkyl and non-functionalised C1-C8-alkyl groups and the other polymer terminating group is selected from the group consisting of hydrogen, hydroxyl, α-iminoalkan-ω-ol and amino.

The etching solution for copper and copper alloy surfaces comprises the polyamides containing at least one polymeric moiety according to formula (I) preferably in a total concentration of 1 to 2000 mg/l. Said concentration range allows for optimal results to be obtained. Concentrations outside said range result in inferior etching results. E.g. higher concentrations may produce too strong etching of treated copper or copper alloy surfaces.

The polyamide containing at least one polymeric moiety according to formula (I) can be prepared by standard literature methods or purchased as such. The cationic polymerization of suitably functionalised oxazoline and/or oxazine derivatives yielding polyoxazolines, polyoxazines or the respective copolymers as described e.g. by R. Hoogenboom, M. W. M. Fijten, M. A. R. Meier, U. S. Schubert, Macromolecular Rapid Communications, 2003, volume 24 (1), pages 92-97 and K. Aoi, M. Okada, Progress in Polymer Science, 1996, volume 21, pages 151-208 (particularly sections 5 and 6 therein, pages 160-189) is particularly preferred because of the ease of synthesis. Alternative procedures for its preparation include radical polymerization of vinyl amides or suitable polyalkylenimines may be converted into the polyamide containing at least one polymeric moiety according to formula (I) by reaction with suitable additives such as acyl chlorides (or acid chloride).

To avoid undesired side-reactions during the synthesis of the polyamides containing a polymeric moiety according to formula (I), it is preferred that $R^1$ does not comprise any unsaturated moieties such as double bonds or triple bonds. Such unsaturated moieties might impair the effectiveness of the synthesis and thus may result in a reduced usefulness of the polyamide. For the same reason, it is even more preferred that the $R^1$ are selected from unsubstituted alkyl groups.

The etching solution comprises at least one oxidising agent suitable to oxidise copper. Oxidising agents suitable to oxidise copper typically have a standard oxidation potential greater than copper for a given concentration and pH value. Typically, the concentration of the at least one oxidising agent suitable to oxidise copper ranges from 0.05 to 20 wt.-%, preferably from 1.0 to 10.0 wt.-% or 15 wt.-%.

Preferably, the at least one oxidising agent is selected from the group consisting of peroxides such as hydrogen peroxide, metal peroxides like sodium peroxide, potassium peroxide; metal superoxides such as potassium superoxide; copper ions and ferric ions. To prevent decomposition of peroxides, other additional compounds such as p-phenolsulphonic acid can be added. Peroxides and superoxides are preferably contained in a concentration ranging from 1 to 150 g/l.

Ferric ions can be provided by any water-soluble source of ferric ions such as iron (III) salts (i.e. ferric salts) or iron (III) complexes. Preferably, the source of ferric ions is selected from the group consisting of ferric sulphate ($Fe_2(SO_4)_3$), ferric chloride ($FeCl_3$), ferric bromide ($FeBr_3$), ferric nitrate ($Fe(NO_3)_3$), ferric acetate ($Fe(OC(O)CH_3)_3$), ferric hydroxide ($Fe(OH)_3$), the respective hydrates thereof or mixtures of the aforementioned. Ferric ions are preferably contained in a concentration ranging from 1 to 50 g/l.

Copper ions can be provided by any water-soluble source of copper ions such as copper salts or copper complexes. Any water-soluble copper salt is a possible source of copper ions, preferable sources of copper ions are copper (II) sulphate, copper (II) chloride, copper (II) bromide, copper (II) acetate, copper (II) formiate, copper (II) oxide, copper (II) hydroxide, copper (II) alkylsulphonate, copper (II) arylsulphonate, hydrates thereof or mixtures of the aforementioned. Copper ions are preferably contained in a concentration ranging from 1 to 70 g/l.

More preferably, the at least one oxidising agent is selected from the group consisting of copper ions and ferric ions. Even more preferably, the etching solution comprises at least one source of ferric ions and at least one source of copper ions as oxidising agents.

The etching solution comprises at least one acid. Said at least one acid is preferably selected from the group consisting of sulphuric acid, alkyl sulphonic acids such as methane sulphonic acid, aryl sulphonic acids such as phenylsulphonic acid, toluenesulphonic acid, nitric acid, phosphoric acid, formic acid, acetic acid, propionic acid and mixtures thereof. Sulphuric acid, alkyl sulphonic acids and aryl sulphonic acids are more preferred because of their high conductivity rendering them extremely useful where the etching solution is to be regenerated by electrolytic means. The total concentration of above-named acids preferably ranges from 10 to 250 g/L.

The etching solution according to the invention comprises at least one source of halide ions. Sources of chloride ions and sources of bromide ions are preferred. Fluoride ions may form hydrofluoric acid in acidic media which is very toxic and difficult to handle whereas iodic ions may be oxidised in the etching solution rendering them ineffective. Examples of suitable sources of chloride ions are water-soluble chloride salts. Preferably, the at least one source of chloride ions is selected from the group consisting of hydrogen chloride, water soluble metal chlorides such as alkali chlorides like lithium chloride, sodium chloride, potassium chloride and caesium chloride, earth alkaline chlorides like manganese chloride, calcium chloride, strontium chloride and barium chloride, transition metal chlorides like manganese chloride, iron chloride, cobalt chloride, nickel chloride, copper chloride and zinc chloride, ammonium chloride and mixtures thereof. More preferably, the at least one source of chloride ions is selected from the group consisting of hydrogen chloride, alkali chlorides and ammonium chloride. Examples of suitable sources of bromide ions are water-soluble bromide salts. Preferably, the at least one source of bromide ions is selected from the group consisting of hydrogen bromide, water soluble metal bromides such as alkali bromides like lithium bromide, sodium bromide, potassium bromide and caesium bromide, earth alkaline bromides like manganese bromide, calcium bromide, strontium bromide and barium bromide, transition metal bromides like manganese bromide, iron bromide, cobalt bromide, nickel bromide, copper bromide and zinc bromide, ammonium bromide and mixtures thereof. More preferably, the at least one source of bromide ions is selected from the group consisting of hydrogen bromide, alkali bromides, ammonium bromide and zinc bromide. The concentration of halide ions is preferably chosen in dependence of the oxidising agent present in the etching solution. The concentration of all halide ions preferably ranges from 1 to 500 mg/l, more preferably from 10 to 200 mg/l and most preferably from 20 to 100 mg/l if ferric ions are used as sole oxidising agent. These concentrations are applicable also for peroxides or superoxides as sole oxidising agents. The concentration of all halide ions preferably ranges from 0.1 to 200 g/l, more preferably from 1 to 100 g/l, if copper ions are used as sole oxidising agent. Ferric halides or copper halides as oxidising agents may also provide the optional halide ions. Halide ions improve the etching results insofar that undesired etching of very thin copper lines such as those of less than 10 μm in width can be prevented and the line shape alteration is less pronounced.

The etching solution according to the invention optionally comprises at least one azole corrosion inhibitor selected from the group consisting of benzotriazole, 5-methylbenzotriazole, 1H-1,2,3-methylbenzotriazole, imidazole, 1H-1,2,3-triazol, 4-methylthiazole, 3-amino-1H-1,2,4-triazole, 1H-tetrazole, 5-methyl-1H-tetrazole, 5-phenyl-1H-tetrazole and 5-amino-1H-tetrazole. Preferably, the azole corrosion inhibitor is selected from 1H-tetrazole, 5-methyl-1H-tetrazole, 5-phenyl-1H-tetrazole and 5-amino-1H-tetrazole as such tetrazole derivatives provide improved stability of the etching solution. The addition of azole corrosion inhibitors advantageously reduces the corrosion of the metal surfaces to be treated due to the formation of a protective azole layer and sometimes they also decrease the formation of precipitates from the etching solution during use. Occasionally, after some copper dissolution from the copper or copper alloy surface precipitates are formed which limit the lifetime of the etching solution. The total concentration of the optional azole corrosion inhibitor preferably ranges from 0.01 to 2.0 wt.-% if the etching solution comprises at least one azole corrosion inhibitor.

The etching solution according to the invention optionally comprises at least one polyalkylene glycol compound such as polyethylene glycol, polypropylene glycol, copolymers of polyethylene glycol and polypropylene glycol and derivatives thereof which all may improve the wettability of the copper or copper alloy surface to be treated and thus the etching behaviour of the etching solution according to the present invention. The total concentration of the optional polyalkylene compounds in the etching solution ranges from 100 to 2000 mg/l, if the etching solution comprises at least one polyalkylene compounds.

The etching solution according to the invention optionally comprises at least one source of ferrous ions. Ferrous ions can be provided by any water-soluble source of ferrous ions such as iron (II) salts (i.e. ferrous salts) or iron (II) complexes. Preferably, the source of ferrous ions is selected from the group consisting of ferrous sulphate ($FeSO_4$), ammonium ferrous sulphate ($(NH_4)_2Fe(SO_4)_2$), ferrous chloride ($FeCl_2$), ferrous bromide ($FeBr_2$), ferrous nitrate ($Fe(NO_3)_2$), ferrous acetate ($Fe(OC(O)CH_3)_2$) and ferrous hydroxide ($Fe(OH)_2$) and the respective hydrates thereof. The optional ferrous ions are preferably used in a concentration ranging from 1 to 50 g/l. The use of the optional ferrous ions is particularly useful when ferric ions are used as oxidising agent and a regeneration of the etching solution is desired.

The etching solution according to the invention is an aqueous solution. This means that the prevailing solvent is water. Other solvents which are miscible with water such as polar solvents including alcohols, glycols and glycol ethers may be added. For its ecologically benign characteristics, it is preferred to use water only (i.e. more than 99 wt.-% based on all solvents).

The pH value of the etching solution according to the invention preferably is ≤7, more preferably ≤4.

The etching solution according to the invention can be prepared by dissolving all components in water. Should solubility issues arise pH adjustors such as acids and bases can be used to increase the solubility of the components to be dissolved. It can also be prepared by providing concentrates which are then diluted and/or mixed prior to use of the etching solution according to the invention.

In one embodiment of the present invention, the etching solution is an aqueous solution comprising or consisting of
  a) at least one polyamide containing at least one polymeric moiety according to formula (I);
  b) at least one acid;

c) at least one oxidising agent suitable to oxidise copper;
d) at least one source of halide ions;
e) at least one solvent, preferably water;
f) optionally, at least one azole corrosion inhibitor;
g) optionally, at least one polyalkylene compounds; and
h) optionally, at least one source of ferrous ions in above-defined concentrations for the individual components.

In a preferred embodiment of the present invention (referred to herein as "ferric ion etching solution"), the etching solution is an aqueous solution comprising or consisting of
a) at least one polyamide containing at least one polymeric moiety according to formula (I); preferably in a concentration of 1 to 2000 mg/l (based on the total amount of all polyamides)
b) at least one acid;
c) at least one sources of ferric ions, preferably in a concentration ranging from 1 to 50 g/l;
d) at least one source of halide ions;
e) at least one solvent, preferably water;
f) optionally, at least one azole corrosion inhibitor; and
g) optionally, at least one polyalkylene compounds.

In another preferred embodiment of the present invention (referred to herein as "copper ion etching solution"), the etching solution is an aqueous solution comprising or consisting of
a) at least one polyamide containing at least one polymeric moiety according to formula (I); preferably in a concentration of 1 or 50 to 2000 mg/l (based on the total amount of all polyamides)
b) at least one acid;
c) at least one sources of copper ions, preferably in a concentration ranging from 1 to 70 g/l;
d) at least one source of halide ions;
e) at least one solvent, preferably water;
f) optionally, at least one azole corrosion inhibitor; and
g) optionally, at least one polyalkylene compounds.

The ferric ion etching solution and the copper ion etching solution are particular useful for improving the adhesion strength of subsequently laminated organic matrices onto such treated copper or copper alloy surfaces. The ferric ion etching solution is also useful for differential etching while preserving the geometrical forms of such treated copper or copper alloy lines reducing the risks of undercuts. An etching solution comprising peroxide or superoxide as oxidising agent is inter alia useful for roughening of copper or copper alloy surfaces. Complete removal of seed layers even in areas with high conductor density is possible with the etching solution according to the invention.

The etching solution according to the invention can be used for etching of copper and copper alloy surfaces, thus allowing for subsequently tightly bound organic matrices or final finishes such as immersion tin to the copper or copper alloy surface or to the an organic matrix bound thereon while avoiding substantial line shape alteration, undercuts and line width reductions. Sufficient adhesion of organic matrices and final finishes can thus be provided.

The method for treating a copper or copper alloy surface according to the invention comprises the steps
(i) providing a substrate comprising a copper or copper alloy surface; and
(ii) contacting at least a portion of said copper or copper alloy surface with the etching solution according to the invention.

The steps are carried out in the order given above.

Substrates in the context of the present invention can be any substrate comprising a copper and copper alloy surface. Substrates can be made of copper or copper alloys in their entirety or alternatively, they comprise surfaces made of copper or copper alloys. Preferably, substrates are selected from copper foils, copper alloy foils, printed circuit boards, IC substrates, interposers, copperised semiconductor wafers and copper clad laminates (CCL). Copperised semiconductor wafers means wafer substrates with copper or copper alloy structures thereon such as trenches, lines, dots and so forth.

Copper surfaces are defined herein to be preferably made of 99 wt.-% or more of copper. The term "copper alloys" according to the present invention preferably refers to alloys consisting of 90 wt.-% to 99 wt.-% copper. Preferably, the further components of the alloy are selected from one or more of boron, silicon, phosphorous or another metal such as nickel, iron, cadmium, zinc, tin, titanium. Particular preference is given to electrolytically deposited (ED) copper and copper alloys surfaces, more preferably those having average grain sizes $d_{50}$ of 1 to 5 µm as determined by SEM (scanning electron microscopy).

Step (ii) is herein referred to as "treatment step". The contact of at least a portion of the copper or copper alloy surfaces with the etching solution can be effected by any means known in the art. Typically, the etching solution can be sprayed, wiped or otherwise brought onto the copper or copper alloy surface or the copper or copper alloy surface can be dipped or immersed into the etching solution. Preferably, the etching solution is sprayed on said surface. Spraying improves the regeneration of the etching solution generally, but in particular in case of the copper ion etching solution. The transport of the etching solution to the surface is also improved and diffusion processes are minimised.

The etching solution can also be used in horizontal equipment, reel-to-reel, vertical and vertically conveyorized equipment.

The temperature of the etching solution in step (ii) preferably ranges from 20 to 50° C. Higher temperatures of the etching solution result in faster etching processes of the copper or copper alloy surface. However, too high temperatures may be detrimental to the stability of the etching solution.

The time of contact of the etching solution and the copper or copper alloy surface has to be adjusted to the temperature of the etching solution and the desired etch depth. The time of contact of the etching solution and the copper or copper alloy surface ranges typically from 5 to 300 seconds. In some cases it is necessary to adjust the time of contact to the desired etch result, e.g. if more copper is to be removed. This adjustment can be performed by routine experiments if necessary.

It is preferable to provide an air feed or oxygen feed into the etching solution while contacting it to the copper or copper alloy surface. An air feed or oxygen feed can be exemplarily be provided by bubbling these gases into the etching solution. This improves the mixing and reduces the necessary treatment times and/or improves uniformity of the etching.

The method according to the invention may comprise rinsing steps with solvents such as water during the individual process steps. Particularly, after the contact of the copper or copper alloy surface with the etching solution, it is advisable to rinse the copper or copper alloy surface with water to remove any undesired remnants of the solution. The method according to the invention may further comprise drying steps. It is possible for example to rinse the copper or copper alloy surface with hot water after the treatment step followed by drying with hot air or in an oven. Then, the copper or copper alloy surfaces may be immersed or treated otherwise with a dilute acid solution (e.g. 10 wt.-% hydrochloric acid or 10 wt.-% sulphuric acid) prior to any further processing.

In certain processes according to prior art, some or all of the added copper ions are removed by bleeding (removing) an adequate amount of etching solution and adding (feeding) fresh etching solution to the remaining solution.

One particular method to remove copper ions from an aqueous solution is to electrolytically reduce copper ions to metallic copper. In principle, a second tank equipped with an anode and a cathode and a rectifier is required for electrolysis. Portions of the etching solution according to the present invention are transferred from a first tank where or from which the etching of copper or a copper alloy layer is performed to a second tank equipped for electrolysis. During electrolysis, copper ions are cathodically reduced to metallic copper and at the same time ferrous ions are oxidised anodically to ferric ions.

The metallic copper can be collected and recycled. Without an electrolytic regeneration cell, the oxidising agent (such as ferric ions) would have to be continuously added to the etching solution. By application of the above described regeneration, the spent ferric ions are regenerated at the anodes ($Fe^{2+}$ is oxidised to $Fe^{3+}$) and thereby no adding (feeding) of the oxidising agent during use of the etching solution is required.

A method and an apparatus useful for this process are disclosed in US 2006/0175204 A1. This method involves feeding of the etching solution into an electrolysis cell being hermetically sealed or having an anode hood, the electrolysis cell comprising a cathode, an inert anode, means for removing the electrolytically deposited copper from the cathode and means for collecting the removed copper and applying a potential to the removed copper, wherein the electrolysis cell does not have an ion exchange membrane or a diaphragm. Alternatively, chemical oxidants can be used for the regeneration of oxidising agents suitable to oxidise copper such as ferric ions. Useful chemical oxidants for this purpose are inter alia peroxides, persulphates such as sodium persulphate and ozone.

The method for treating a copper or copper alloy surface according to the invention optionally further comprises the following step (ia) pre-treatment of the copper or copper alloy surface.

The pretreatment is performed between steps (i) and (ii). Pre-treatment methods of copper and copper alloy surfaces are known in the art. Such pretreatment includes inter alia cleaning steps, removal of undesired layers such as chromate and/or oxide layers, and the deposition of organic monolayers (e.g. monolayers of azole corrosion inhibitors, leveller or brightener compounds which are typically used in electrolytic copper plating).

Cleaning of copper and copper alloy surfaces can be accomplished by various means known in the art. Typically, such cleaning steps use aqueous solutions which may be acidic or alkaline which optionally comprise surfactants and/or cosolvents such as glycols. Chromate layers can be removed by oxidative treatments employing for example aqueous solutions containing sodium persulphate and/or other oxidising agents. Oxide layers or other undesired residuals on the copper or copper alloy surface can be removed by acidic aqueous treatments. Organic monolayers can be formed by treating copper or copper alloy surfaces with aqueous solutions comprising azole corrosion inhibitors such as benzotriazole.

The method for treating a copper or copper alloy surface according to the invention optionally further comprises the following step (iii) contacting the copper or copper alloy surface with a post-dip solution.

This step is referred to as "post-dip step".

Optional step (iii) (post-dip step) is included in the method for treating a copper or copper alloy surface according to the invention after step (ii) (treatment step). The contacting of the copper or copper alloy surface and the post-dip is selected from the same possibilities as given for the contact between the etching solution and the copper or copper alloy surface in step (ii). The same or a different contact possibility may be chosen. If a post-dip step was performed, it is advantageous to rinse the copper or copper alloy surface thoroughly or to remove the any residues therefrom otherwise prior to photoresist or solder-mask applications.

The post-dip step uses either an alkaline post-dip solution or an acidic post-dip solution. The acidic post-dip solution is an aqueous solution containing at least one acid, preferably hydrochloric acid. The pH value of the acidic post-dip is typically 1 or less. The acidic post-dip is typically used if copper chloride was used as oxidising agent in the etching solution. Alternatively, an acidic post-dip may be used if a photo-resist is applied subsequently or at a later stage of the method according to the invention because photo-resists are labile to alkaline treatments or such alkaline remnants present on a surface whereon such a photo-resist is to be deposited.

The alkaline post-dip solution is an aqueous solution containing at least one source of hydroxide ions ($OH^-$). Such sources of hydroxide ions can be any water-soluble compounds which upon contact with water liberate or form otherwise hydroxide ions such as bases. Preferably, sources of hydroxide ions are selected from metal hydroxides such as alkali hydroxides and amines such as ammonia. The pH value of the alkaline post-dip solution is typically 10 or higher. The alkaline post-dip solution is optionally used if a solder mask is to be applied subsequently or at any later stage because solder masks are labile to acidic treatments, acidic remnants on a surface whereon such a solder mask is to be deposited or if oxidising agents other than copper ions are present in the etching solution.

The method for treating a copper or copper alloy surface according to the invention optionally further comprises the following step (iv) laminating an organic matrix onto the treated copper or copper alloy surface.

Organic matrices include but are not limited to prepregs, solder masks, photo-resists and the like. Prepregs are fibre-reinforced plastics, typically glass-reinforced epoxy-matrices are used such as FR-4, FR-5 and sequential build-up films (e.g. Ajinomoto GX92, Ajinomoto GXT31).

Alternatively or further to step (iv) it is possible to include step (v) deposition of a final finish on the treated copper or copper alloy surfaces or portions thereof into the method according to the invention.

Said final finishes include such finishes as immersion tin, electroless nickel immersion gold (ENIG), electroless nickel electroless palladium electroless gold (ENEPIG), electroless palladium electroless gold (EPIG), immersion silver, organic solder preservatives (OSP) and the like. These finishes are well-established in the art. Useful tin deposition methods e.g. include immersion tin plating as described in EP 2476779 B1.

Advantageously, the method according to the invention and the use of the etching solution according to the invention result in little or no line shape deterioration due to little or no copper dissolution from the sides of copper trenches and lines. Due to the presence of the polyamide containing at least one polymeric moiety according to formula (I) in the etching solution, the etch rate becomes (almost) independent of the spray pressure which in turn results in more homogeneous etching results, especially if resist layouts are varied or if the line in space ratios are altered on a single substrate.

The following non-limiting examples further illustrate the present invention.

Examples

Figures 3, 3A:
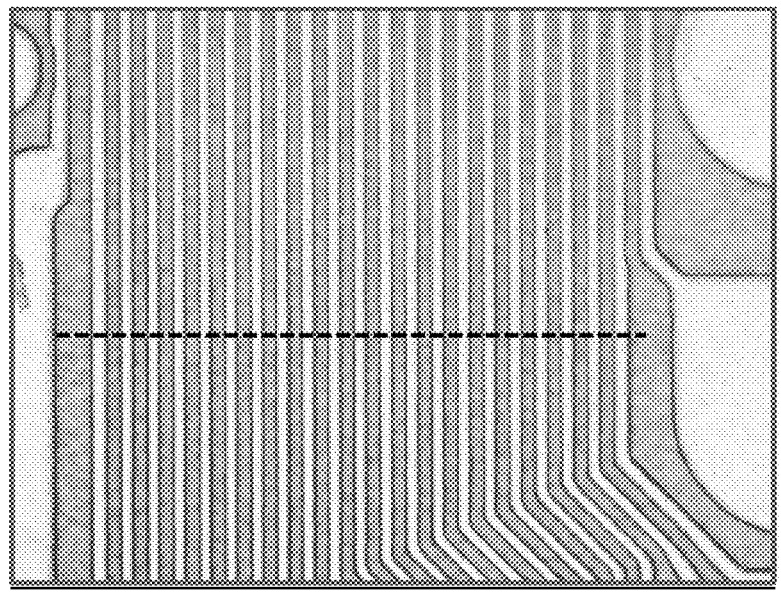
FIG. 3 shows a picture of a circuitized SAP test board (FIG. 3A, abbreviated to circuitized board herein) and a cross section thereof (FIG. 3B) used e.g. in Application Examples 3 to 6. The dashed line in FIG. 4A depicts the position of the cross section.

The etching solutions were prepared by dissolving all components in water or if necessary in dilute acidified solution. ED copper foils used in the experiments had an average grain size of 0.5-3 μm as determined by SEM of electro-polished samples. Circuitized boards used in the experiments comprised 22 copper lines which were analysed before and/or after treatment in a cross section. The individual copper lines had a layout as depicted in FIG. 3 and given in Table I.

TABLE I

Layout of the circuitized boards.

| Line number | Amount lines per sample | Mean line size top [μm] | Mean line size bottom [μm] |
|---|---|---|---|
| 1; 22 | 2 | 21.1 | 22.2 |
| 4; 5-15; 21 | 13 | 17.3 | 18.2 |
| 2; 3; 16-20 | 7 | 16.1 | 17.2 |

The adhesion strength values (also referred to as peel strength values) between the treated copper surface and the organic matrix was measured according to the method described in IPC-TM-650 Test Methods Manual Number 2.4.8 revision C.

The smoothness (or roughness) of the outer surface was determined by a scanning atomic force microscope (Digital Instruments, NanoScope equipped with a PointProbe® from Nanosensors with a tip radius of less than 7 nm), scan size: 5×5 μm, scan in tapping mode. RSAI values (relative surface area increase) and $S_a$ (averaged roughness) were obtained by these measurements and are provided with the respective examples below.

The microscopic characterisation of the copper surfaces was performed using Carl Zeiss SMT Ltd. EVO15-07.05 or a Helios NanoLab 650 scanning electron microscopes (SEM, both FEI Company). Alternatively, where applicable, a light microscope (Olympus Optical Ltd., BX 60F-3) was used.

The number average molar mass $M_n$ of the polymers were determined by NMR measurements. The polymers were dissolved in suitable solvents such as $D_2O$ or $d_4$-methanol and the number average molar mass $M_n$ were calculated based on the integrals of the hydrogen atoms belonging to the starting groups and the integrals belonging to the hydrogen atoms of the polymeric chains. $M_n$ and $M_w$ are transformed into each other using the polydispersity index.

To assess the line shape alteration (and thus the retaining of the desired rectangular shape), the top-bottom-difference was measured. The top-bottom-difference was obtained by measuring the width of the respective copper or copper alloy line at the top (width$_{top}$) and the bottom (width$_{bottom}$) in a cross section. The top-bottom-difference is obtained from the following formula:

$$\text{top-bottom-difference} = \text{width}_{top} - \text{width}_{bottom}$$

Hence, a negative top bottom difference relates to a copper line which was etched predominantly at the top whereas a positive top-bottom-difference means that the etching at the bottom of said copper lines prevailed. Top-bottom-difference of treated copper lines should be as close to zero as such copper lines have a rectangular shape.

The formation of undercuts were quantified by measuring the distance (α in FIG. 5) of the copper line boundary and the imaginary prolongation (β in FIG. 5) of the overstanding copper line in a cross section (see FIG. 5). If undercuts are present on both sides of a copper line, the two values are added to form the total undercut which is in this case provided in the experiments herein. Generally, no undercuts are desired, however, the smaller said value a in FIG. 5 is the better.

The line width reduction was obtained from measuring the size of the copper lines before and after treatment. The smaller said value is the better.

The etch rate was obtained by treating a copper clad laminate for 60 s and measuring the mass before and after etching. The difference thereof can be recalculated to the etch rate for 60 s.

Lupasol G 500 (product by BASF SE) is a polyethylenimine having a mass average molar mass of 25000 amu. Comparative is sometimes abbreviated herein as comp. and inventive as inv.

Synthetic Example A

A reaction flask was heated to 70° C. and purged with argon for 1 h to remove any water traces therefrom. Then, 36.0 g 2-ethyl-4,5-dihydrooxazole were dissolved in said flask in 50 ml water-free dimethylacetamide in an argon atmosphere. After addition of 0.777 g benzyl bromide as starting reagent, the reaction mixture was heated to 100° C. and stirred at said temperature for 20 h. Upon cooling to 25° C., a red-orange solution of the polyamide was obtained which was quenched with 1 ml water as terminating reagent. The volatile components were removed under reduced pressure. The reaction mixture was dissolved in 80 ml chloroform and 200 ml n-hexane were added. The resulting upper phase was discarded once clear and any volatiles were removed from lower phase under reduced pressure and in vacuo.

The resulting orange solid (quantitative yield) was the desired polyamide having a mass average molar mass $M_n$ of 2200 amu.

Synthetic Example B to C

Following the procedure given for Synthetic Example 1, other oxazole and oxazine derivatives were (co-)polymerized. The reagents and results are given in Table II.

TABLE II

Polymerization results.

| # | Monomer 1 | Monomer 2 | Starting reagent | Terminating reagent | Yield [%] | $M_n$ [amu] |
|---|---|---|---|---|---|---|
| B | (2-methyl-4,5-dihydrooxazole) 16.8 g (198 mmol) | None | (benzyl bromide) 0.78 g (4.5 mmol) | $H_2O$ 1.0 g (55.5 mmol) | 100 | 4000 |
| C | (2-methyl-4,5-dihydrooxazole) 10.0 g (118 mmol) | (2-methyl-5,6-dihydro-4H-1,3-oxazine) 11.8 g (118 mmol) | (benzyl bromide) 1.0 g (5.9 mmol) | $H_2O$ 1.0 g (55.5 mmol) | 99 | 4000 |

Application Example 1

Aqueous etching solutions each containing 25 g/l ferric ions (added as iron (III) sulphate), 160 ml/l sulphuric acid (50 wt.-%), 30 mg/l chloride ions (added as sodium chloride) and additives as given in Table III were prepared.

ED copper foils were pre-treated with an aqueous solution containing 150 g/L sodium persulphate and 130 mL/L sulphuric acid (50 wt.-%) at 35° C. for 15 seconds to remove the chromate layer. After rinsing with deionised water, such treated ED copper foils were ready for use. Above-described etching solutions were sprayed (1.8 bar, 35° C.) onto the ED copper foils. The treatment time was adjusted in order to have comparable etch depths as given in the following table for all test specimens. After rinsing again, the samples were dried with fan blower at 60° C. Samples were laminated onto prepregs (Isola 104 ML FR-4 ("FR-4") from Isola Group S.a.r.l., $T_g$=135° C.). The results of the adhesion strength value measurements are summarized in the following table. The adhesion strength values are given for various etch depth, namely 0.3 μm, 0.5 μm and 0.8 μm, respectively.

The polyamide of inventive Application Examples 1 b to 1 d comprised one polymeric moiety according to formula (I) wherein $R^1$ was methyl, a was 1 and the mass average molar mass was 50000 amu.

The polyamide of inventive Application Examples 1e to 1g comprised one polymeric moiety according to formula (I) wherein $R^1$ was methyl, a was 1 and the mass average molar mass was 500000 amu.

TABLE III

Adhesion strength values in dependency of etch depth.

| Example no. | Additive and concentration [mg/l] | Adhesion strength [N/cm] 0.3 μm³ | 0.5 μm³ | 0.8 μm³ | AFM measurements at 0.5 μm etch depth SA [nm] | RSAI [%] |
|---|---|---|---|---|---|---|
| 1a comp. | No additive | 1.1 | 1.0 | 1.3 | 56 | 18 |
| 1b inv. | Polyamide[1], 12.5 | 3.8 | 4.6 | 5.1 | n.d. | n.d. |
| 1c inv. | Polyamide[1], 25.0 | 4.7 | 5.0 | 4.7 | 104 | 28.5 |
| 1d inv. | Polyamide[1], 37.5 | 3.5 | 3.4 | 3.4 | n.d. | n.d. |
| 1e inv. | Polyamide[2], 60.0 | 6.5 | 7.5 | 8.5 | n.d. | n.d. |
| 1f inv. | Polyamide[2], 70.0 | 9.7 | 10.7 | 8.5 | 120 | 36.8 |
| 1g inv. | Polyamide[2], 80.0 | 9.9 | 8.1 | 6.9 | n.d. | n.d. |
| 1h comp. | Polyethylenimine, 70.0 | 2.1 | 0.9 | 1.1 | 66 | 12.8 |
| 1i comp. | Polyvinylpyrrolidinone, 70.0 | 2.4 | 2.2 | 1.7 | 98 | 30.5 |

[1] 50000 amu;
[2] 500000 amu,
[3] etch depth;
comp. means comparative;
inv. means inventive;
n.d. not determined.

The results of the adhesion strength measurements of the inventive examples are superior to the comparative example 1a containing no such additive. The adhesion strength was largely independent from the etch depth for all tests.

Notably, the adhesion strength of the copper surfaces treated with the etching solution comprising the polyamide having the higher $M_w$ is significantly improved compared to the result obtained from the polyamide having an $M_w$ of 50000 amu. The optimal concentration of the polyamide having the higher $M_w$ was around 70 mg/l. Higher concentration did not increase the adhesion any more. For the smaller polyamide the best concentration found was 25 mg/l; also, in this case higher concentration did not yield in any further improvement of the adhesion strength.

The use of other polymers results in significantly lower adhesion strength values. Also, the roughnesses of copper surfaces treated with the comparative etching solutions are less pronounced which might be one reason as to why the adhesion to the organic matrix is weak.

Application Example 2

Three etching solutions were prepared by dissolving the components in water:

Application Example 2a (comparative): 10 g/kg ferric ions (added as iron(III) chloride), 50 g/kg formic acid and 25 mg/kg polyethylenimine Application Example 2b (comparative): 15 g/l copper (added as copper (II) sulphate, 80 g/l chloride (added as sodium chloride), 100 g/l formic acid, 0,001 g/l ferric ions (added as iron(III) sulphate, 25 mg/l polyvinylpyrrolidone Application Example 2c (method according to the present invention): 15 g/l ferric ions (added as iron (III) sulphate), 30 g/l copper (II) ions (added as copper (II) sulphate), 160 ml/l sulphuric acid (50 wt.-%), 60 mg/l chloride ions (added as sodium chloride) and one polyamide comprising one polymeric moiety according to formula (I) wherein $R^1$ was methyl, a was 1 and the mass average molar mass was 50000 amu.

Circuitized boards were used without any pretreatment. Each of the above-described etching solutions were sprayed (1.8 bar, 35° C.) onto individual circuitized boards. The treatment time was adjusted in order to clean the copper seed layer completely. After rinsing again, the samples were dried with fan blower at 60° C. Then, a cross section was formed and the geometric features (undercuts, top-bottom-difference, line width reduction) were evaluated.

TABLE IV

Geometric features of treated copper lines.

| Example no. | Additive and concentration [mg/l] | Etch depth [μm] | Undercuts [μm] | Top-bottom-difference [μm] | Line width reduction [μm] |
|---|---|---|---|---|---|
| 2a comp. | polyethylenimine, 25.0 | 2.4 | 1.7 | 4.9 | 3.9 |
| 2b comp. | Polyvinylpyrrolidone, 25.0 | 2.2 | 11.2 | 1.2 | 6.3 |
| 2c inv. | Polyamide, 25.0 | 1.2 | 0.3 | 1.3 | 3.7 |

The comparative examples 2a and 2b using polyethylenimine and polyvinylpyrrolidone, respectively, resulted in stronger undercut formation than inventive example 2c. The top-bottom-difference of the copper line treated with the etching solution containing polyethylenimine showed a comparable line width reduction as the inventive example but the copper lines were not rectangular as desired which can be seen from the high value for the top-bottom-difference.

Although, the top-bottom-difference of the treated copper lines in comparative example 2b was sufficient, the severe undercut formation and the significant line width reduction rendered the results unacceptable.

The inventive example 2c on the other hand showed little undercut formation while retaining the rectangular shape of the treated copper lines (expressed by the top-bottom-difference) and acceptable line-width reduction.

Application Example 3: Etching Performance

Aqueous etching solutions each containing 15 g/l ferric ions (added as iron (III) sulphate), 30 g/l copper (II) ions (added as copper (II) sulphate), 160 ml/l sulphuric acid (50 wt.-%), 30 mg/l chloride ions (added as sodium chloride) and additives as given in Table V were prepared.

Circuitized boards were used without any pretreatment. The individual etching solutions were heated to 35° C. and sprayed onto circuitized copper boards (1.5 bar). The etch depth was adjusted to 0.2 μm more than necessary for complete seed layer removal.

Then, a cross section of said treated copper clad laminate was formed and the individual 22 copper lines were analysed in terms of line shape alteration (top-bottom-difference), line width reduction and undercut formation. The results are summarized in Table V.

TABLE V

Etching performance of etching solutions containing various additives.

| # | Additive (concentration in mg/l) | Top-bottom-difference [μm] | Line Width Reduction [μm] | Undercuts [μm] |
|---|---|---|---|---|
| 3a | No additive (—) | −3.3 | 3.5 | −0.5 |
| 3b | Polyamide[1] (75) | −0.6 | 2.1 | −0.2 |
| 3c | Lupasol G500 (75) | −4.1 | 4.5 | −0.6 |
| 3d | Polyethylenimine[2] (75) | −4.2 | 4.6 | −0.9 |

TABLE V-continued

Etching performance of etching solutions containing various additives.

| # | Additive (concentration in mg/l) | Top-bottom-difference [μm] | Line Width Reduction [μm] | Undercuts [μm] |
|---|---|---|---|---|
| 3e | Polyvinylpyridin[3] (75) | −2.3 | 2.8 | −0.1 |
| 3f | Polyvinylpyrrolidone[4] (75) | −1.0 | 2.5 | 0.2 |

Figure 3B:
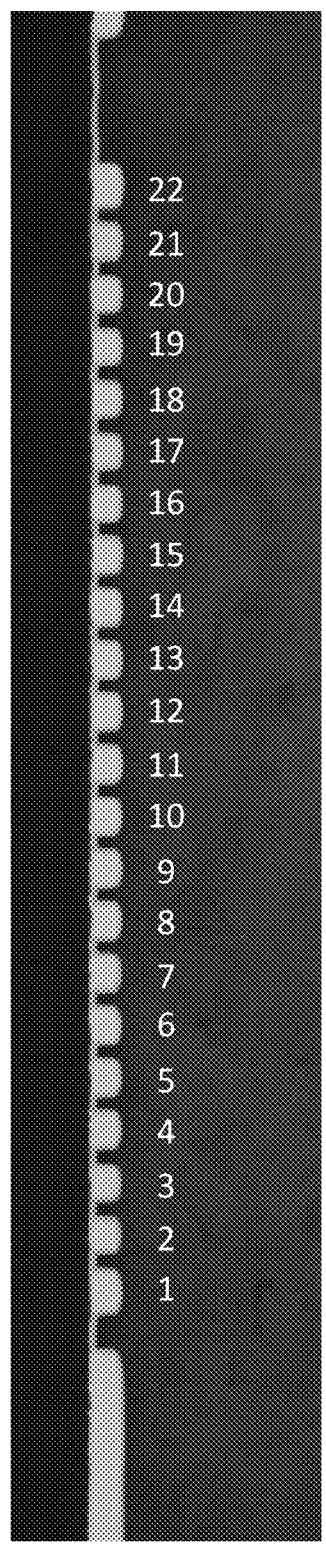
Figure 4:
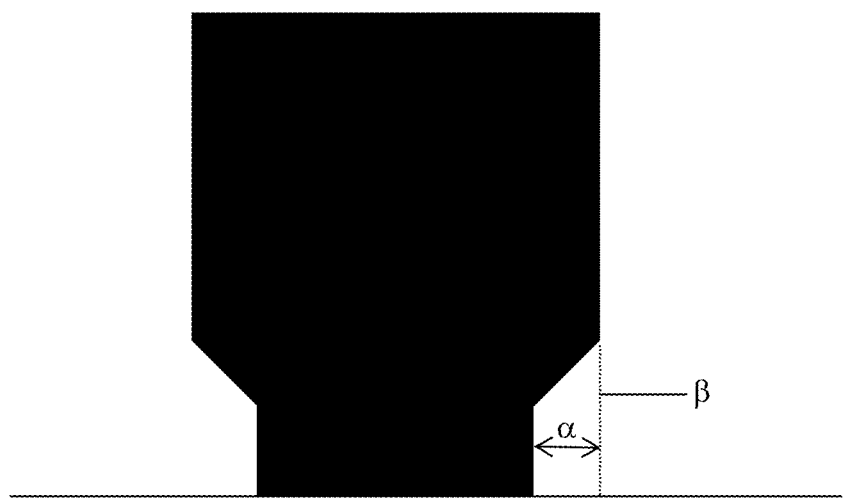
FIG. 4 illustrates the measurement of undercuts.

[1] $M_w$ = 50000 amu,
[2] $M_w$ = 1200 amu,
[3] $M_w$ = 60000 amu,
[4] $M_w$ = 29000 amu Application Examples 3a, 3c to 3f are comparative examples whereas Application Example 3b is one according to the invention. The results of the treatments can be seen in FIG. 3 which shows cross sections of copper lines treated with the etching solutions of Application Example 3. FIG. 3A relates to Application Example 3a, FIG. 3B to Application Example 3b, FIG. 3C to Application Example 3c, FIG. 3D to Application Example 3d, FIG. 3E to Application Example 3e, and FIG. 3F to Application Example 3f.

Comparative application example 3a did not contain any additives and showed severe line shape alteration as well as line width reduction. Such results are unacceptable.

Inventive Application Example 3b contained a polyamide comprising a polymeric moiety according to formula (I) wherein $R^1$ was methyl and a was always 1. The line shape alteration and line width reduction was improved in comparison to the etching solution of comparative Application Example 3a which did not contain any additives. The top bottom difference and the line width reduction were improved and the formation of undercuts was almost entirely avoided.

Comparative Application Example 3d contained the Lupasol G 500 which is a polyethylenimine. The line shape alteration and the line width reduction of copper lines treated with an etching solution containing said additive were unacceptable and even worse compared to the results obtained from an etching solution containing no additives (Application Example 3a).

Also, comparative Application Example 3e contained a second polyethyleneimine having a smaller mass average molar mass. However, the results were similar to those obtained by comparative Application Example 3d and thus unacceptable.

The use of polyvinylpyridine in comparative Application Example 3e showed better results than the polyethylenimine of the foregoing comparative Application Examples. However, the results were still unacceptable (especially, top bottom difference and line width reduction) and worse than those of inventive example 3b.

Polyvinylpyrrolidone of Application Example 3f showed acceptable line shape alterations and undercuts. Still, the results were still inferior to those of the inventive Application Example 3b.

Application Example 4: Spray Pressure Variation

Aqueous etching solutions each containing 15 g/l ferric ions (added as iron (III) sulphate), 15 g/l ferrous ions (added as iron (II) sulphate), 30 g/l copper (II) ions (added as copper (II) sulphate), 160 ml/l sulphuric acid (50 wt.-%), 30 mg/l chloride ions (added as sodium chloride) and additives as given in Table VI were prepared.

In a spray module (volume 1l), etching solutions (35° C.) were sprayed on copper clad laminates at various spray pressures. In Table VI, the effect of the spray pressure on the etch rate is given in relation to the etch rate obtained for each formulation used at 0.5 bar spray pressure. All values are provided as percentage of said value of 0.5 bar spray pressure.

The polyamide of inventive Application Example 4b comprised one polymeric moiety according to formula (I) wherein $R^1$ was methyl, a was 1 and the mass average molar mass was 50000 amu.

TABLE VI

Additives used and spray pressure dependency on etch rate.

| | | | Spray pressure [bar] | | | | |
|---|---|---|---|---|---|---|---|
| # | Additive | c [mg/l] | 0.5 | 1.0 | 1.5 | 2.0 | 2.5 |
| 4a | — | — | 100 | 166 | 212 | 224 | 235 |
| 4b | Polyamide (inventive) | 75 | 100 | 102 | 100 | 100 | 100 |
| 4c | Polyvinylpyridine | 75 | 100 | 130 | 148 | 154 | 160 |
| 4d | Polyethylenimine[1] | 75 | 100 | 136 | 169 | 180 | 192 |
| 4e | Lupasol ® G 500 | 75 | 100 | 140 | 167 | 184 | 195 |
| 4f | Polyvinylpyrrolidone[2] | 75 | 100 | 113 | 119 | 123 | 124 |

[1] 1200 amu,
[2] 29000 amu

Inventive Application Example 4b showed no etch rate dependency on the spray pressure. This is particularly useful when treating surfaces with varying aspect ratios or L/S (lines in space) ratios. If the etch rate on the surface is spray pressure independent a similar etch result on densed and isolated structures will be ensured.

Comparative Application Examples 4a and 4c to 4f all showed an increase of the etch rate with increasing spray pressure. This is disadvantageous as copper surfaces with structures and apertures of different sizes will be etched inhomogeneously. This is due to local flow characteristics in such apertures.

Application Example 5

Aqueous etching solutions each containing 15 g/l copper (II) ions (added as copper (II) sulphate), 100 g/l formic acid (50 wt.-%), 80 g/l chloride ions (added as sodium chloride), 1 mg/l ferric ions (added as ferric sulphate pentahydrate) and additives as given in Table VII were prepared.

In an 8 l spray module, circuitized boards were subjected to a spray treatment with above-described etching solutions (35° C., 0.5 bar). The copper lines on said circuitized boards were measured after said treatment and the respective values can be found in Table VII.

Application Example 5a is a comparative Example. The polyamide of inventive Application Examples 5b comprised one polymeric moiety according to formula (I) wherein $R^1$ was ethyl, a was 1 and the mass average molar mass was 50000 amu.

TABLE VII

Etching results.

| # | c [mg/l] | Line width reduction [μm] | Top-bottom-difference [μm] |
|---|---|---|---|
| 5a | — | 7.2 | 4.2 |
| 5b | 500 | 0.5 | 1.4 |

The addition of the polyamide significantly to the comparative etching solution of Application Example 5a improved the line width reduction and the top-bottom-difference significantly.

Application Example 6: Use of Synthetic Examples A to C

Aqueous etching solutions each containing 15 g/l ferric ions (provided as iron(III) sulphate), 160 ml/l sulphuric acid (50 wt.-%), chloride ions (added as sodium chloride) and additives as given in Table VIII were prepared.

In a 2l spray module, circuitized boards were subjected to a spray treatment with above-described etching solutions (35° C., 1.5 bar). The copper lines on said circuitized boards were measured before and after said treatment and the respective values can be found in Table VIII.

The etch depth was adjusted to 0.6 μm and the line width reduction was measured.

TABLE VIII

Concentration dependency of polyamides on etching results.

| # | Synthetic Example | c [mg/l] | chloride [mg/l] | Etch depth [μm] | Line width reduction |
|---|---|---|---|---|---|
| 6a | A | 100 | 60 | 0.6 | 2.8 |
| 6b | B | 100 | 60 | 0.6 | 2.3 |
| 6c | C | 100 | 60 | 0.6 | 2.2 |

TABLE VIII-continued

Concentration dependency of polyamides on etching results.

| # | Synthetic Example | c [mg/l] | chloride [mg/l] | Etch depth [μm] | Line width reduction |
|---|---|---|---|---|---|
| 6d | A | 100 | 30 | 0.6 | 2.2 |
| 6e | B | 100 | 30 | 0.6 | 2.4 |
| 6f | C | 100 | 30 | 0.6 | 2.0 |

The homopolymers of Synthetic Example A and B showed slightly higher line width reductions than the copolymer of Synthetic Example C. This was almost independent of the chloride concentration in the etching solution.

Application Example 7

Aqueous etching solutions each containing 25 g/l ferric ions (added as iron (III) sulphate), 30 g/l copper (II) ions (added as copper (II) sulphate), 160 ml/l sulphuric acid (50 wt.-%), 60 mg/l chloride ions (added as sodium chloride) and additives as given in Table IX were prepared.

DC panels were pre-treated with an aqueous solution containing 150 g/L sodium persulphate and 130 mL/L sulphuric acid (50 wt.-%) at 35° C. for 15 seconds to remove the chromate layer. After rinsing with deionised water, such treated ED copper foils were ready for use. Above-described etching solutions were sprayed (1.8 bar, 35° C.) onto the DC panels. The treatment time was adjusted in order to have comparable etch depths as given in the following table for all test specimens. After rinsing again, the samples were dried with fan blower at 60° C. Solder masks were attached (Green Cure soldermask, LM600, application according to manufacturer's specification as provided in the technical datasheet) followed by immersion tin deposition (Stannatech 2000 V, product of Atotech Deutschland GmbH, application according to manufacturer's specification as provided in the technical datasheet). The adhesion strength was determined with a tape test (Scotch Crystal Tape, 45°) for various etch depth, namely 0.3 μm, 0.5 μm and 0.8 μm. Thereafter, the substrates were inspected optically whereby the number of green residues were counted. Said green residues represent the individual attachment points of said soldermasks (here in total 9). The results are provided in Table IX.

The polyamide of inventive Application Example 7b comprised one polymeric moiety according to formula (I) wherein $R^1$ was methyl, a was 1 and the mass average molar mass was 500000 amu.

TABLE IX

Adhesion strength values in dependency of etch depth.

| Example no. | Additive and concentration [mg/l] | Tape test results | | |
|---|---|---|---|---|
| | | 0.3 μm[1] | 0.5 μm[1] | 0.8 μm[1] |
| 7a Comparative | No additive | | 9 | |
| 7b Inventive | Polyamide, 12.5 | 1 | 1 | 1 |

[1]etch depth

The soldermask was completely removed by the tape test for the comparative Application Example 7a. Contrary to that, the soldermask adhered much better to the DC panel treated with the inventive etching solution in Application Example 7b. Only 1 green spot was observed whereas the comparative DC panel counted 9 of those.

Other embodiments of the present invention will be apparent to those skilled in the art from a consideration of this specification or practice of the invention disclosed herein. It is intended that the specification and examples be considered as exemplary only, with the true scope of the invention being defined by the following claims only.

The invention claimed is:

1. An aqueous etching solution for copper and copper alloy surfaces comprising at least one acid, at least one oxidising agent suitable to oxidise copper, at least one source of halide ions characterised in that the solution further comprises at least one polyamide containing at least one polymeric moiety according to formula (I)

wherein each a is independently from each other selected from 2 and 3; each b is an integer independently from each other ranging from 5 to 10000; each $R^1$ is a monovalent residue independently from each other selected from the group consisting of substituted or unsubstituted C1-C8-alkyl groups.

2. The etching solution for copper and copper alloy surfaces according to claim 1 characterised in that the at least one polyamide containing at least one polymeric moiety according to formula (I) has a mass average molar mass of 1,000 to 500,000 amu.

3. The etching solution for copper and copper alloy surfaces according to claim 1 characterised in that the at least one polyamide containing at least one polymeric moiety according to formula (I) has a mass average molar mass of 5,000 to 100,000 amu.

4. The etching solution for copper and copper alloy surfaces according to claim 1 characterised in that each $R^1$ is independently from each other selected from the group consisting of methyl, ethyl, n-propyl, iso-propyl, n-butyl, iso-butyl, sec-butyl and tert-butyl.

5. The etching solution for copper and copper alloy surfaces according to claim 1 characterised in that the at least one polyamide containing at least one polymeric moiety according to formula (I) contains two polymer terminating groups independently from each other selected from the group consisting of hydrogen; hydroxyl; amino; thiol; substituted or unsubstituted C1-C8-alkyl groups; iminoalcohols; aralkyl groups; and aryl groups.

6. The etching solution for copper and copper alloy surfaces according to claim 1 characterised in that the at least one polyamide consists of at least one polymeric moiety according to formula (I) and two polymer terminating groups.

7. The etching solution for copper and copper alloy surfaces according to claim 6 characterised in that one polymer terminating group is selected from the group consisting of aralkyl and non-functionalised C1-C8-alkyl groups and the other polymer terminating group is selected from the group consisting of hydrogen, hydroxyl, α-iminoalkan-ω-ol and amino.

8. The etching solution for copper and copper alloy surfaces according to claim 1 characterised in that the at least one polymeric moiety according to formula (I) is linear.

9. The etching solution for copper and copper alloy surfaces according to claim 1 characterised in that it comprises polyamides containing at least one polymeric moiety according to formula (I) in a total concentration of 1 to 2000 mg/l.

10. The etching solution for copper and copper alloy surfaces according to claim 1 characterised in that the at least one oxidising agent suitable to oxidise copper is selected from the group consisting of hydrogen peroxide; metal peroxides; metal superoxides; copper ions and ferric ions.

11. The etching solution for copper and copper alloy surfaces according to claim 10 characterised in that the at least one oxidising agent is selected from the group consisting of copper ions and ferric ions.

12. The etching solution for copper and copper alloy surfaces according to claim 1 characterised in that the at least one acid is selected from the group consisting of sulphuric acid, alkyl sulphonic acids, aryl sulphonic acids, nitric acid, phosphoric acid, formic acid, acetic acid, propionic acid and mixtures thereof.

13. The etching solution for copper and copper alloy surfaces according to claim 1 characterised in that the at least one source of halide ions is selected from sources of chloride ions and sources of bromide ions.

14. A method for treating a copper or copper alloy surface according to the invention comprises the steps
   (i) providing a substrate comprising at least one copper or copper alloy surface; and
   (ii) contacting at least a portion of said copper or copper alloy surface with the etching solution according to claim 1.

15. The method for treating a copper or copper alloy surface according to claim 14 characterised in that the substrate comprising a copper or copper alloy surface is selected from copper foils, copper alloy foils, printed circuit boards, IC substrates, interposers, copperised semiconductor wafers and copper clad laminates.

16. The etching solution for copper and copper alloy surfaces according to claim 4 characterised in that the at least one polyamide containing at least one polymeric moiety according to formula (I) contains two polymer terminating groups independently from each other selected from the group consisting of hydrogen; hydroxyl; amino; thiol; substituted or unsubstituted C1-C8-alkyl groups; iminoalcohols; aralkyl groups; and aryl groups.

* * * * *